United States Patent
Chen et al.

(10) Patent No.: US 11,015,790 B2
(45) Date of Patent: May 25, 2021

(54) SLIM LINEAR LED LIGHTING DEVICE

(71) Applicant: EXCELLENCE OPTOELECTRONICS INC., Chunan Town (TW)

(72) Inventors: Yen-Cheng Chen, Chunan Town (TW); Sheng-Hua Yang, Chunan Town (TW); Hsuan-Jung Tsai, Chunan Town (TW); Cheng-Tai Jao, Chunan Town (TW); Chih-Chiang Chang, Chunan Town (TW)

(73) Assignee: EXCELLENCE OPTOELECTRONICS INC., Chunan Town (TW)

( * ) Notice: Subject to any disclaimer, the term of this patent is extended or adjusted under 35 U.S.C. 154(b) by 2 days.

(21) Appl. No.: 16/668,649

(22) Filed: Oct. 30, 2019

(65) Prior Publication Data

US 2020/0386390 A1 Dec. 10, 2020

(30) Foreign Application Priority Data

Jun. 10, 2019 (TW) ............................... 108119922

(51) Int. Cl.
*F21V 23/00* (2015.01)
*F21S 4/22* (2016.01)

(52) U.S. Cl.
CPC ............. *F21V 23/004* (2013.01); *F21S 4/22* (2016.01)

(58) Field of Classification Search
CPC .. F21V 23/004; F21S 4/22; F21S 4/20; H01L 33/48; H01L 25/0753
See application file for complete search history.

(56) References Cited

U.S. PATENT DOCUMENTS

| 8,764,220 B2 | 7/2014 | Chan et al. | |
| 2004/0223327 A1* | 11/2004 | Kuan | F21V 29/74 362/249.01 |
| 2014/0265809 A1 | 9/2014 | Hussell | |

(Continued)

FOREIGN PATENT DOCUMENTS

| CN | 205979313 U | 2/2017 |
| CN | 108700731 A | 10/2018 |

(Continued)

OTHER PUBLICATIONS

European Search Report dated Dec. 17, 2019 from European Application No. EP19208472.

*Primary Examiner* — Anabel Ton
(74) *Attorney, Agent, or Firm* — Innovation Capital Law Group, LLP; Vic Lin

(57) ABSTRACT

A slim linear LED lighting device is provided, including: a printed circuit board on which a connecting circuit is provided, at least one power input component, and a plurality of LED Bars. The LED Bar is formed by a plurality of the same kind of LED chips, and has a slim strip-shaped condensing lens structure integrally formed in the LED Bar packaging process by molding process to control the beam angle of the LED Bar and therefore the light distribution of the slim linear LED lighting device. The LED Bar's condensing lens has a small cross-sectional dimension; therefore the effective utilization factor of the light is improved as the slim linear LED lighting device is applied to a linear automotive lamp designed with a thin light blade structure.

19 Claims, 12 Drawing Sheets

(56) References Cited

U.S. PATENT DOCUMENTS

| | | | | |
|---|---|---|---|---|
| 2014/0301085 A1* | 10/2014 | Hwang | ................... | H01L 33/32 |
| | | | | 362/308 |
| 2015/0219966 A1* | 8/2015 | Song | ........................ | F21V 7/04 |
| | | | | 362/97.3 |
| 2019/0063694 A1 | 2/2019 | Kang | | |

FOREIGN PATENT DOCUMENTS

| | | |
|---|---|---|
| JP | 07023827 | 5/1995 |
| JP | 2011233315 A | 11/2011 |
| JP | 2012059736 A | 3/2012 |
| JP | 2012253111 A | 12/2012 |
| JP | 2015029081 A | 2/2015 |
| JP | 2016167518 A | 9/2016 |
| KR | 20140094138 A | 7/2014 |
| TW | M302218 U | 12/2006 |
| TW | M578656 U | 6/2019 |
| WO | 2010058904 A2 | 5/2010 |
| WO | 2016178322 A1 | 11/2016 |

* cited by examiner

SLIM LINEAR LED LIGHTING DEVICE

FIELD OF THE DISCLOSURE

The present invention relates to a slim linear LED lighting device which can exhibit visually continuous and uniform light output, in particular, to a slim linear LED lighting device applied to a linear shaped lamp (for example, a vehicular lamp) designed with a thin light blade structure and having a fine size and better utilization efficiency of light.

BACKGROUND OF THE DISCLOSURE

In the prior art, LEDs have many characteristics of high brightness, energy saving, multi-color and rapid change, and have been widely used in various fields of illumination. In the field of vehicular lamps, LEDs have also become one of the most important light sources. For the development of vehicular lamp, the earliest LED based lamps are characterized by multi-point light sources to distinguish them from incandescent bulbs. At present, vehicular lamps have evolved into demand for planar light source or linear light source that visually requires uniform illumination. Because the LED is similar to point light source, it must be combined with other additional optical components, such as reflectors, diffusers, refractive lenses, etc., in order to convert the discrete point light source into a uniform planar light source or linear light source. However, these additional optical components would cause the lamp body to become larger or thicker, resulting in that it is difficult to be designed or adopted to streamlined or confined-space vehicular lamps. In addition, as is well known, the vehicular lamp has a regulatory light distribution requirement. Most of the vehicular lamps, including daytime running lamps (DRL), turn signal lamps, stop lamps and tail lamps, have the highest luminous intensity requirements in the center direction (i.e. H-V direction) of photometric test. The photometry of automotive lamps also specify minima of light intensity in certain specific directions, for example, the daytime running lamp has specified minima of light intensity for the range of 20 degrees on the left and right and 5 degrees on the top and bottom. Therefore, the beam angle of the light source must also match the design of vehicular lamps for photometry.

Linear LED light sources are commonly used in LED lamps for general lighting purposes and LED light bars for liquid crystal backlights. The structure of aforementioned linear LED light sources contains a plurality of packaged LEDs, which are formed by using an SMT process to make them equidistantly arranged on a PCB. For the LED light sources of monochromatic light, the LEDs used are often packaged by a single LED chip only which appear as point light sources, and then arranged in a strip-shaped light source by a plurality of packaged LEDs. The former is used for general illumination and requires uniform illumination. Usually, an additional secondary lens or diffuser is required, or a similar function of the lampshade is used to diffuse the discrete light source of the LED into a uniform and continuous light distribution. Due to the presence of secondary lenses or diffusers, the cross-sectional dimensions of such LED tube lamps are therefore too large to be directly used in vehicular lamps with limited space and complicated structures.

As for the conventional LED light bar for liquid crystal backlight, the light guide is used to enable the horizontal incident light of LED to form a vertical upward light mainly through the total internal reflection inside the light guide and the scattered reflection at the optical patterns on the bottom side of light guide, and then a uniform surface light source is formed through the light diffusing plate on the upper layer of the backlight. The structure and light distribution of such a liquid crystal backlight are intended to be uniform luminance with wider viewable angle rather than high luminous intensity at certain directions, and are not required for the beam angle of the LED light source and the luminous intensity in the front direction, and hence, they are only suitable for indoor use of a notebook or a television set. These conventional LED light strips are not suitable for use on vehicular lamps that have specific light distribution requirements and demand of high luminous intensities to be operated in the daytime, such as daytime running lamp, turn signal lamps, etc.

Regarding the Patent No.: U.S. Pat. No. 8,764,220, entitled "LINEAR LED LIGHT MODULE", the technical disadvantages disclosed in the specification are as follows. Because the size and spacing of the LED light source are relatively large, in order to achieve the purpose of visually uniform illumination, it is necessary to combine the light diffusing plate to improve the uniformity of light output. However, the size of the LED light module is increased and the light intensity in the center direction is greatly reduced, and it is thus only suitable for general illumination and cannot be applied to linear vehicular lamps.

Regarding the Patent No.: CN 2059793130 entitled "SMD LED FLEXIBLE LIGHT BAR", the shortcomings of the patented design are as follows. 1. Using the packaged LED as the light source would lead to that the size and spacing of the light source are relatively large. It is still difficult to achieve visually uniform illumination even if the silicone layer is added to make the LED light diffused. 2. The silicone light-emitting surface is a flat design, and thus lacks a light condensing effect and results in a low luminous intensity in the center direction, which is not suitable for the requirements of the aforementioned vehicular lamp photometry regulations.

In recent years, it is commonly seen that light guides have been applied to vehicular lamps, and it is indeed possible to utilize a limited lamp body space to produce a line-shaped or block-shaped light emitting surface. However, since the light of the LED light source only enters from the end or side of the light guide, the long length of the light guide and the bending of the light guide due to the design of the vehicular lamp would result in a visually uneven light distribution. In addition, because of the limited number of light sources, the shortcomings of the design of vehicular lamps formed of the light guide are that the lighting cannot be segmented or partitioned, and cannot meet the requirements of the animated lighting function.

Some vehicular lamp manufacturers use a plurality of packaged LEDs arranged in a linear shape as a light source, in combination with a thin light blade design, so that the LED light enters from one end of the light blade and exits from the other end of the light blade to achieve the high-quality linear vehicular lamp performance having visually uniform illumination and animated lighting function. Since the thickness of the light blade limits the ratio of the LED light entering the light blade and the sidelight of the light source greater than a certain angle is escaped from the light blade, whether this type of design can meet the photometry regulatory requirements of the vehicular lamp is closely related to the total flux of the LED light source, the beam angle and the size of LED light source, which affect utilization factor of the LED light (i.e., the ratio of the light entering the light blade to the total light output of LED). Generally, the total flux of an LED light source can be increased by increasing the number of LEDs or increasing the LED driving current, so that the photometry requirement of the vehicular lamp is met. However, the amount of heat generated by the LED light source is also increased, and the problem of heat dissipation and cost increase thus become unavoidable in such case. Therefore, how to reduce the beam angle, the size of the LED light source and the gap between the LED light source and the light blade to improve the utilization factor of the LED light have become the design focus and key technology of such LED lighting device.

Regarding the Patent No.: CN 108700731 A, entitled "OPTICAL LENS, AND LIGHT UNIT AND LIGHTING DEVICE HAVING SAME", the disadvantages of the invention are as follows. 1. The LED light bar uses packaged LEDs plus an additional condensing lens (also known as the secondary lens). There is always an air gap between the LED light source and the secondary lens in such design, which will result in the conventional Fresnel loss, lowering the utilization factor of the LED light. 2. The packaged LED has a certain size which is quite large and different from that of the point light source, so that the size of the designed secondary lens is always relatively large in dimension. When the light blade of a vehicular lamp is thin, the sidelight of the LED light source is escaped from the light blade, which deteriorates the effective utilization factor of the LED light. 3. How to firmly fix the secondary lens on the light bar in the application of vehicular lamps which requires vibration resistance will also be a technical problem. Even if the secondary lens fixing structure design has no problem, the width of the light bar becomes wider due to the fixing structure, and the requirements for the streamlined and confined-space vehicular lamp are no longer satisfied.

SUMMARY OF THE DISCLOSURE

The present invention discloses a slim linear LED lighting device. In view of the above-mentioned shortcomings of the prior art, a structure and a manufacturing technique of a slim linear LED lighting device are provided, which are applied to a linear lamp having a thin light blade, in particular to vehicular lamps, to effectively solve the technical problems of the existing LED light source applied to the high-quality vehicular lamp, including the visually visible granular LED, non-uniform brightness, granular bright spots, low utilization factor of light, insufficient luminous intensity, and having no animated lighting function. One of the features of the present invention is to utilize a special LED Bar packaged of a plurality of same kind of LED chips as a light source. The LED Bar itself is a continuously and visually uniform linear light source, which is different from the use of a granular LED package as a light source, and is particularly suitable for high-quality linear vehicular lamps. Another feature of the present invention is that the LED Bar used has a condensing lens structure as a part of package. For a vehicular lamp having a light blade structure, the lighting device of the present invention can effectively enhance the effective utilization factor of the light entering the light blade and improve the luminous intensity in the center direction to meet the light distribution requirements of vehicular lamps (such as DRL or front turn signal lamp). Yet another feature of the present invention is that the width and height of the light source can be less than 2 mm, which is suitable for a vehicular lamp having a thin light blade, so as to meet the design requirements of streamlined and confined-space vehicular lamps.

The present invention discloses a slim linear LED lighting device, comprising a printed circuit board on which a connecting circuit is provided, at least one power input component (such as a connector or wires) and a plurality of LED Bars, wherein the plurality of LED Bars are arranged in close alignment or at specific pitch according to design requirements. The LED Bar contains a plurality of same kind of LED chips regularly and closely arranged in a line or lines on the upper layer of a substrate with a pitch of 0.2 mm to 3.0 mm, and is formed through die bonding, wire bonding, molding packaging and cutting process. One of the features of the LED Bar is that LED Bar is formed of a plurality of LED chips, and the number of the LED chips is decided according to design requirements. The pitch between two adjacent two LED chips can be as small as possible in order to form a linear and uniform light source. Another feature of the LED Bar is that the LED Bar has a strip-shaped condensing lens (also called a molding lens) structure, and the condensing lens is integrally formed in the LED Bar molding process. The light output of the LED Bar as well as the slim linear LED lighting device along the direction of the LED chip lined up (also called as the longitudinal direction) is visually, continuous and uniform, because of a wide beam angle of each LED chip and the close alignment of the LED chips. The light output of the LED Bar and therefore that of the slim linear LED lighting device in the cross section (perpendicular to the longitudinal direction) is condensed to a small beam angle, between 10 and 80 degrees, so that the luminous intensity at the front direction of the LED Bar is enhanced. The term of beam angle refers to the included angle between the two directions in which the luminous intensity is half of that of the central direction of an LED, and is a term used in the conventional LED's beam pattern or light distribution. Another feature of the LED Bar is that the condensing lens of the LED Bar has a small cross-sectional dimension, so that the slim linear LED lighting device is formed by the LED Bar. As the slim linear LED lighting device is applied to a linear vehicular lamp designed with a light blade structure, the effective utilization factor of the light is increased, enabling a lower total flux of light to meet the photometry regulations. In addition, the lighting of the slim linear LED lighting device of the present invention can be segmented to enable animated lighting function. The slim linear LED lighting device of the present invention can also improve the shortcomings of existing LED-based light source, which has visually non-uniform brightness or obvious granular bright spots. Consequently, the slim linear LED lighting device of the present invention is a preferred lighting device for high-quality linear vehicular lamps.

The slim linear LED lighting device of the present invention can be arranged by a plurality of LED Bars in close alignment, so that not only the illumination length of the slim linear LED lighting device can be increased as the number of LED Bars of the slim linear LED lighting device increases, and the spacing of all the LED chips on the slim linear LED lighting device can be kept consistent to provide a uniform light distribution along the whole lighting device. Consequently, as the slim linear LED lighting device is applied to vehicular lamps designed with a transparent light blade, the vehicular lamps can exhibit a visually continuous and uniform illumination when power is on. In another application of the present invention, the printed circuit board of the slim linear LED lighting device may be a flexible printed circuit board (FPCB) on which the LED Bars having a shorter length is disposed, so that the slim linear LED lighting device of the present invention can be bent as required. Moreover, as the present invention adopts a FPCB or a soft printed circuit board on which a plurality of LED Bars are arranged at specific wide pitches, and the slim linear LED lighting device can be bent into a continuous "L-shaped" step shape, so that the front emitting direction (i.e., front emitting direction of each LED chip) of all LED Bars or a part of the LED Bars are oriented in a specific direction, for example, the direction wherein the photometric test is required. By using this arrangement, the technical problem of low light intensity in H-V direction of photometry due to the curved shape of the light blade and the emitting light of the vehicular lamp not being directed toward the axial direction of vehicle can be solved. Generally, the beam angle of an LED chip is typically about 120-150 degrees, and after being packaged (not having a condensing lens structure), the packaged LED has an beam angle of about 120 degrees. The slim linear LED lighting device disclosed by the present invention may have a relatively smaller beam angle on its cross section due to the LED Bar having a condensing lens structure. By means of the curvature or inclined surfaces of different condensing lenses, the beam angle of the LED Bar on its cross section (perpendicular to the direction in which the LED chips are lined up) is reduced from 120 degrees to between 10 and 80 degrees, so that in addition to enhancing the luminous intensity in the front direction of the LED Bar and therefore that of the slim linear LED lighting device of the present invention, also improving the effective utilization factor of the light in the application to the vehicular lamp designed with light blade structure. In another application of the present invention, the LED Bars are disposed in an arrangement that their strip-shaped condensing lenses are oriented normal to the direction of the LED Bars lined up on the PCB, so that the beam angle of the slim linear LED lighting device of the present invention in the line direction of the LED Bars becomes smaller to meet the need of the photometry test. Consequently, the slim linear LED lighting device of the present invention has advantage that meets the photometry requirements of the vehicular lamps with a relatively lower amount of light illumination (i.e. total flux) or energy consumption.

The LED Bar is packaged on a substrate with a plurality of same kind of LED chips which are arranged in close equidistant spacing. The spacing is between 0.2 mm to 3.0 mm, depending on the type and size of LED chips and design requirements. When an LED Bar is illuminated, it exhibits a visually continuous and uniform illumination, and no discontinuous dark spots are visible. The LED chip arrangement of the LED Bar may be arranged in a straight line or a curved line. When being molded, the shape of the condensing lens is straight or curved according to the arrangement of the LED chips. The dimension of the LED Bar is formed by cutting the substrate along the outer edge shape of the condensing lens on the substrate. Therefore, the shape of the LED Bar can be a straight bar or a curved bar. The substrate of the LED Bar has conductive layers on the upper surface and bottom surface (i.e., front and back sides). The conducting layers of the bottom surface of the substrate are provided with at least one anode terminal, at least one cathode terminal, and a plurality of electrical via holes to connect with the required conductive layers on the upper surface. Therefore, the LED Bar of the present invention can be soldered to the printed circuit board by a conventional surface mount technology (SMT) process.

The specific optical surface shape and curvature of the condensing lens of the LED Bar are designed in the following three categories. First, the center of each LED chip is regarded as a pseudo-point light source, and a semi-convex surface is designed for the top surface of the condensing lens by optical design, and is referred to as a first optical surface of the condensing lens, so that the beam angle of the LED Bar on its cross section at the center point of each LED chip is reduced from 120-150 degrees of the original bare LED chip to a smaller beam angle by the refraction of the first optical surface of the condensing lens, and the luminous intensity in the front direction of the LED Bar is raised, accordingly. Depending on the needs of the application, such as type of vehicular lamp, direction of the light blade, and the light distribution requirements, different curvatures and radians of the of the semi-convex for the first optical surface can be designed to enable the beam angle on the cross section of the LED Bar to be condensed to be between 10 and 80 degrees. For making the illumination of the LED Bar in the longitudinal direction to exhibit a continuous and uniform visional effect, the first optical surface (i.e. the curvature of the cross section of the LED Bar) can be further designed to be consistent in the longitudinal direction of the LED Bar.

Second, an optical design of total internal reflection (TIR) is used for the design of the condensing lens of the LED Bar. The center of each LED chip is regarded as a pseudo-point light source, and an optical design of total internal reflection (TIR) is used to obtain the TIR type optical surfaces (or curvatures) to form another condensing lens structure, such that the sidelight of the LED chip can be directed toward the front direction and then the emitting light of the LED Bar is converged. Depending on the needs of the application, such as type of the vehicular lamp, direction of the light blade, and the light distribution requirements, the different radians and curvatures of the TIR type optical surfaces can be designed to enable the beam angle on the cross section of the LED Bar to be condensed to be between 10 and 80 degrees. For making the illumination of the LED Bar in the longitudinal direction to exhibit a continuous and uniform visional effect, the TIR type optical surface (i.e. the curvature of the cross section of the LED Bar) can be further designed to be consistent in the longitudinal direction of the LED Bar.

Third, an optical design of Fresnel lens is used for the design of the condensing lens of the LED Bar. The center of each LED chip is regarded as a pseudo-point light source and a plurality of Fresnel lenses are designed as the optical surface to form another condensing lens structure for the LED Bar, such that the emitting light of the LED Bar is converged and the height of the condensing lens is reduced. Depending on the needs of the application, such as type of the vehicular lamp, direction of the light blade, and the light distribution requirements, the different radians and curvatures of the Fresnel type optical surface can be designed to enable the beam angle on the cross section of the LED Bar to be condensed to be between 10 and 80 degrees. For making the illumination of the LED Bar in the longitudinal direction to exhibit a continuous and uniform visional effect, the Fresnel type optical surface (i.e. the curvature of the cross section of the LED Bar) can be further designed to be consistent in the longitudinal direction of the LED Bar.

The slim linear LED lighting device of the present invention uses the LED Bar as a light source, and the number of LED chips in the LED Bar can be varied, depending on application requirements. If the pitch of the LED chips remains the same, the length of the LED Bar certainly increases as the number of LED chips contained increases. For a lighting device that requires a certain length of light, when using longer LED Bars, the required SMT processing cost has an opportunity to be reduced due to the less LED Bars are required. But, when the LED Bar is too long, the pick-and-place operation of the SMT may not be easy to operate. In addition, the more the number of LED chips in an LED Bar is, the worse the LED Bar production yield is, due to the quality issue of the LED chip and the quality of the die bonding and wire bonding processes. Therefore, when using LED chips of good quality and uniform performance, such as the sorted LED chips, the LED chips contained in one LED Bar are preferably between 4 and 16.

If other requirements are designed, for example, the LED driver or the signal controller that needs to be set on the same printed circuit board with the LED light source, the slim linear LED lighting device of the present invention can also have the IC for driving LED or the IC for controlling the LED lighting or related electronic components, the power input component, in addition to the LED Bars. The slim linear LED lighting device of the present invention further has a function of driving LED Bars or controlling LED Bars.

The slim linear LED lighting device of the present invention may also be composed of two kinds of LED Bars emitting different colors of light. All the LED Bars emitting the first color light are arranged in a line on the printed circuit board of the slim linear LED lighting device, all of the LED Bars emitting the second color light are arranged in another line on the same printed circuit board, and the two linear array LED Bars are arranged side by side on the same printed circuit board to generate two or more different colors of light. For example, the slim linear LED lighting device of the present invention can be provided with white LED Bars and yellow LED Bars side by side on the same printed circuit board, and can generate white light and yellow light respectively after being powered on, and is applied to a vehicular lamp having a light blade structure, so that the vehicular lamp can be used to perform the function of the daytime running lamp (white light) and the front turn signal lamp (yellow light). In another application of the present invention, the white LED Bars and the yellow LED Bars are arranged in a staggered arrangement in a line on a PCB, rather than being arranged in parallel with each other.

These and other aspects of the present disclosure will become apparent from the following description of the embodiment taken in conjunction with the following drawings and their captions, although variations and modifications therein may be affected without departing from the spirit and scope of the novel concepts of the present invention.

DETAILED DESCRIPTION OF THE EXEMPLARY EMBODIMENTS

Figure 1A:
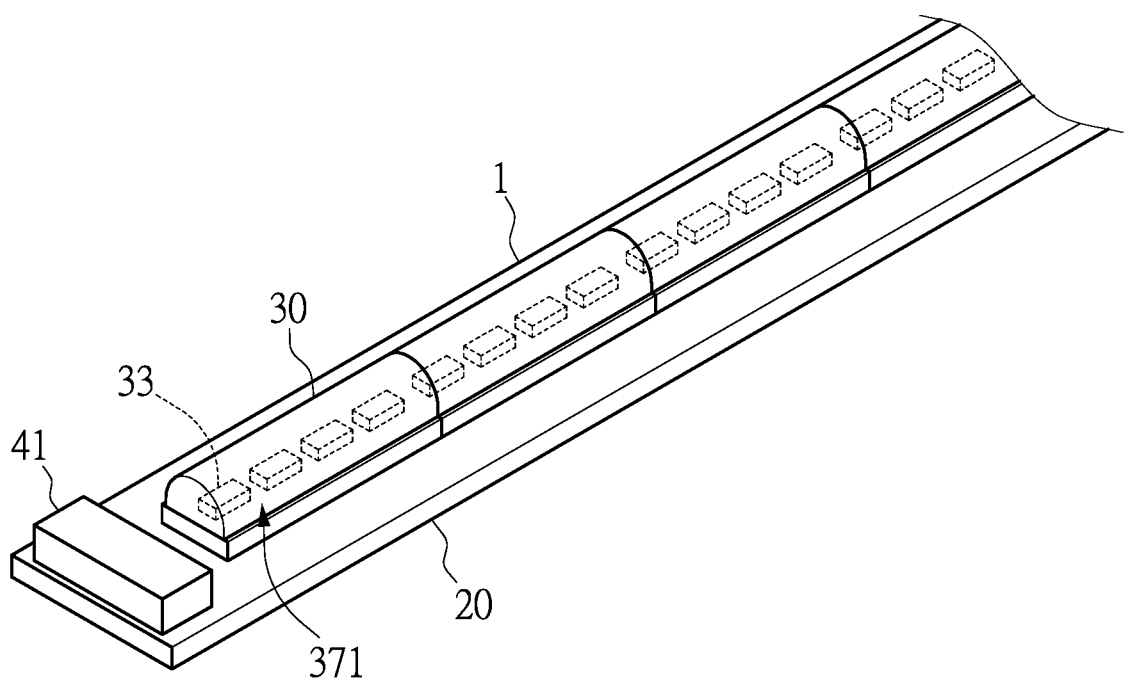
FIG. 1A is a schematic perspective view of the first embodiment of the present invention.
Figure 1B:
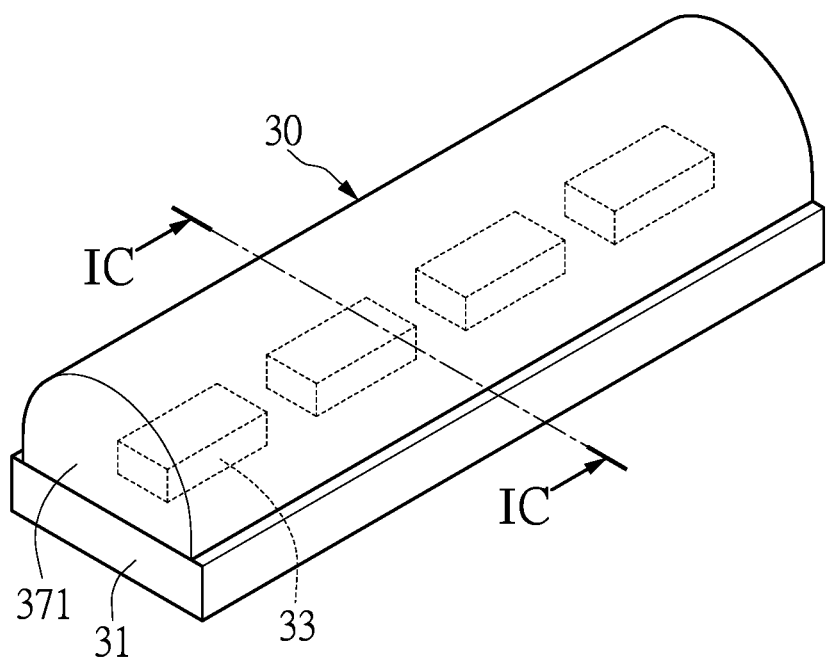
FIG. 1B is a schematic perspective view of an LED Bar in the first embodiment of the present invention.
Figure 1C:
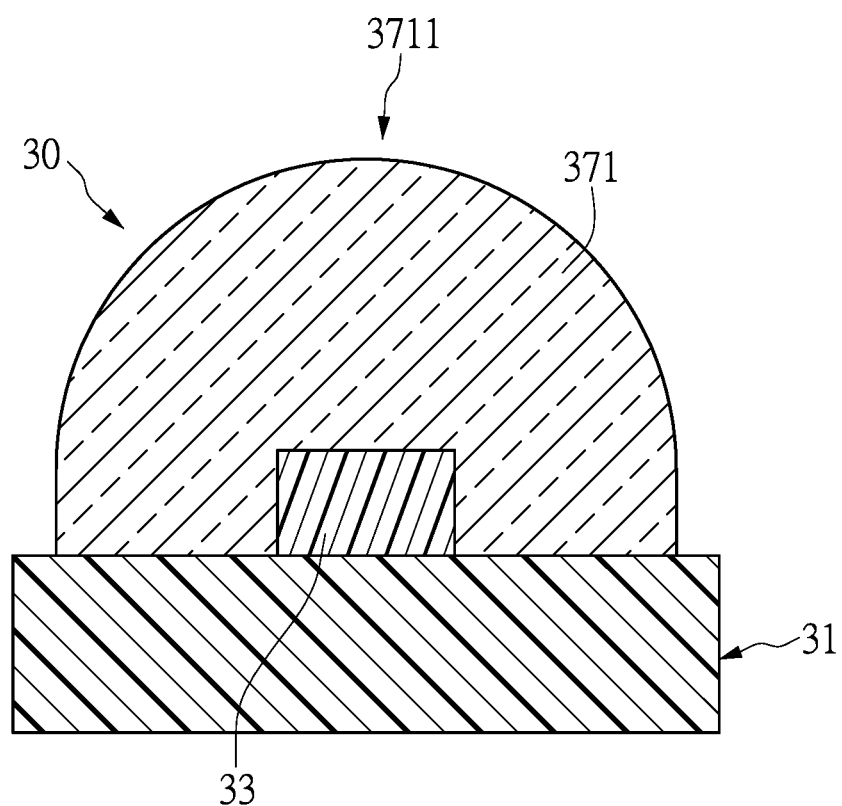
FIG. 1C is a schematic cross-sectional view of an LED Bar in the first embodiment of the present invention.

Referring to FIG. 1A, FIG. 1B and FIG. 1C, FIG. 1A is the first embodiment of a slim linear LED lighting device 1 of the present invention. The slim linear LED lighting device 1 comprises: a printed circuit board (PCB) 20 with connecting circuits (not shown), a connector 41 as power input component and a plurality of LED Bars 30, and is completed through the SMT process. Each of the LED Bars 30 includes four LED chips 33 and a strip-shaped condensing lens 371 having a semi-convex upper surface. FIG. 1B shows the first embodiment of the LED Bar 30, comprising a substrate 31, four same kind of LED chips 33, and a condensing lens 371. The cross section of the strip-shaped condensing lens 371 is constituted by a first optical surface 3711 of a semi-convex arc shape. The semi-convex arc shape of the first optical surface 3711 is designed by optical simulation with regarding the LED chip 33 as a pseudo-point light source, so that the light output generates refraction at the first optical surface 3711 to enable the light output to be condensed toward the center (or front) direction, thereby reducing the beam angle of the light output of the LED Bar 30 in the lateral direction (perpendicular to the direction in which the LED chips 33 are lined up) and further enhancing the luminous intensity in the center direction. The LED chip 33 has a length of about 0.4 mm and a width of about 0.2 mm. The LED chip 33 is one of so called horizontal type LED chips, which has both of P-pad and N-pad on the upper surface of the LED chip (not shown). The LED chips 33 are fixed on the substrate 31 by die bonding process. The LED chips 33 are arranged in a straight line, and the distance between the LED chips 33 is less than 1 mm. Through the wire bonding process, the gold wires (not shown) connect the P-pad (not shown) of each LED chip 33 to the positive wire bonding region (not shown) on the substrate 31, and the N-pad (not shown) of each LED chip 33 to the negative wire bonding region (not shown) on the substrate 31. In silicone molding process, the substrate 31 containing with the LED chips 33 was placed in the mold before the liquid silicone rubber (LSR) is filled in the mold cavity of the mold. The cavity shape of the mold is processed according to the dimension of the required condensing lens. Then, a strip-shaped silicone molding lens having a semi-convex upper surface is formed after a baking process. The four LED chips 33 are completely covered by the silicone molding lens. That is, each of the LED chips 33 is covered with the silicone molding lens at the front, the back, the left, the right and the upper side, completely. Finally, the substrate 31 is cut along the edges and at the specific positions of the silicone molding lens by a precision cutting machine to form a strip-shaped LED Bar 30 which contains four LED chips 33 and a condensing lens 371. If necessary, part of the silicone molding can be cut off, so that the distance between the first LED chip 33 (referring to the LED chip closest to the front edge of the LED Bar 30) and the front edge of the LED Bar 30 is between 0.2 mm and 0.4 mm, and the distance between the last LED chip 33 and the rear edge of the LED Bar 30 is also between 0.2 mm and 0.4 mm. When two LED Bars 30 are mounted closely to form connection, the spacing of any two adjacent LED chips 33 in these two LED Bars 30 can be kept consistent, which is less than 1 mm. In this embodiment, in order to simplify the design and processing cost of the mold, the condensing lens 371 is a convex lens of condensing design, and its cross-sectional curve (as shown in FIG. 1C) is consistent along the longitudinal direction of the LED Bar 30. Therefore in this embodiment, the beam angle on the cross section of the LED Bar 30 is about 60 degrees, however the beam angle in the longitudinal direction (the direction in which the LED chips 33 are lined up) of the LED Bar 30 is much wider, so that the light output of the LED Bar 30 exhibits a continuous and relatively uniform distribution in the longitudinal direction. Here, the 60 degrees and the consistent cross-sectional curve along the longitudinal direction is only an embodiment, and the present invention is not limited thereto. The LED Bar 30 disclosed in the present invention has multiple LED chips and a condensing lens structure which is also called a primary lens, and is different from a traditional packaged LED which is packaged with a single chip and without a primary lens. Hence, one of the features of the present invention is no need of an additional lens (also referred to as a secondary lens) when a small beam angle is needed in certain direction for a linear vehicular lamp. In this embodiment, the width and height of the condensing lens 371 can be less than 2 mm based on the fine chip size of the LED chip 33, so that the linear lighting device of the present invention is slim. Since the LED chips 33 in the LED Bar 30 are regularly and closely arranged in a pitch less than 1 mm and the condensing lens 371 is continuous and consistent in shape along the LED Bar 30, when the LED Bar 30 is powered on, continuous and uniform illumination is exhibited in the longitudinal direction. The LED Bar 30 itself becomes a section of linear light source, and visually, dark spots are not visible in the whole section. In addition, by means of the condensing function of the sealing lens 371, the luminous intensity in front direction of the LED Bar can be increased.

Figure 2A:
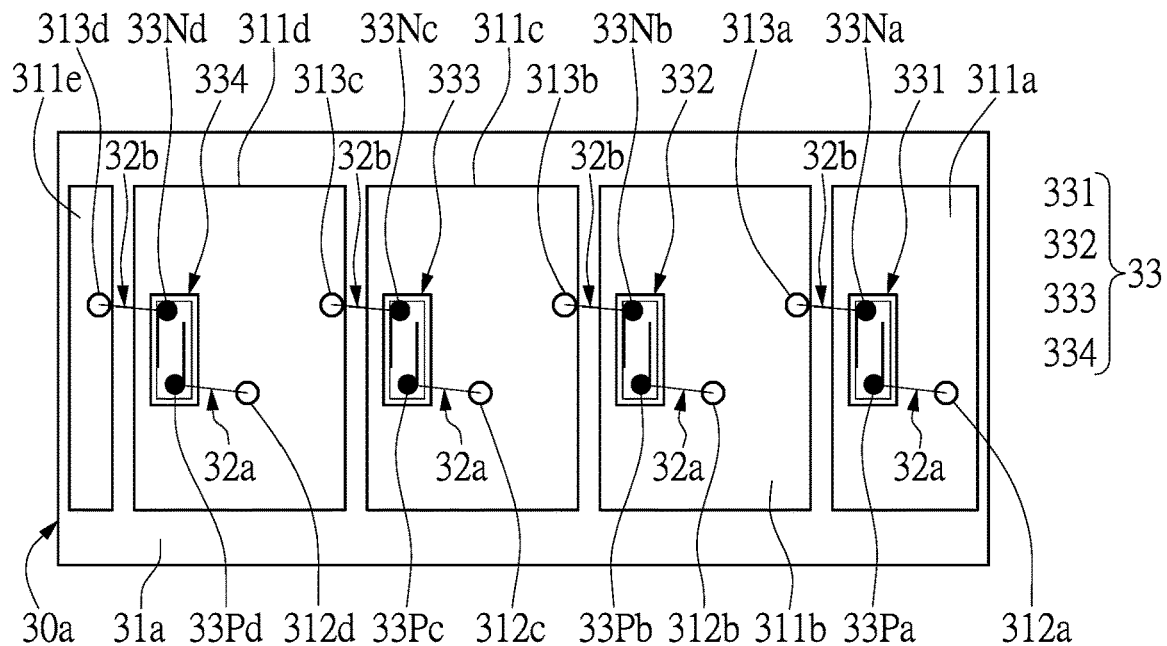
FIG. 2A is a top plan view showing the second type LED Bar fabrication structure according to the first embodiment of the present invention.
Figure 2B:
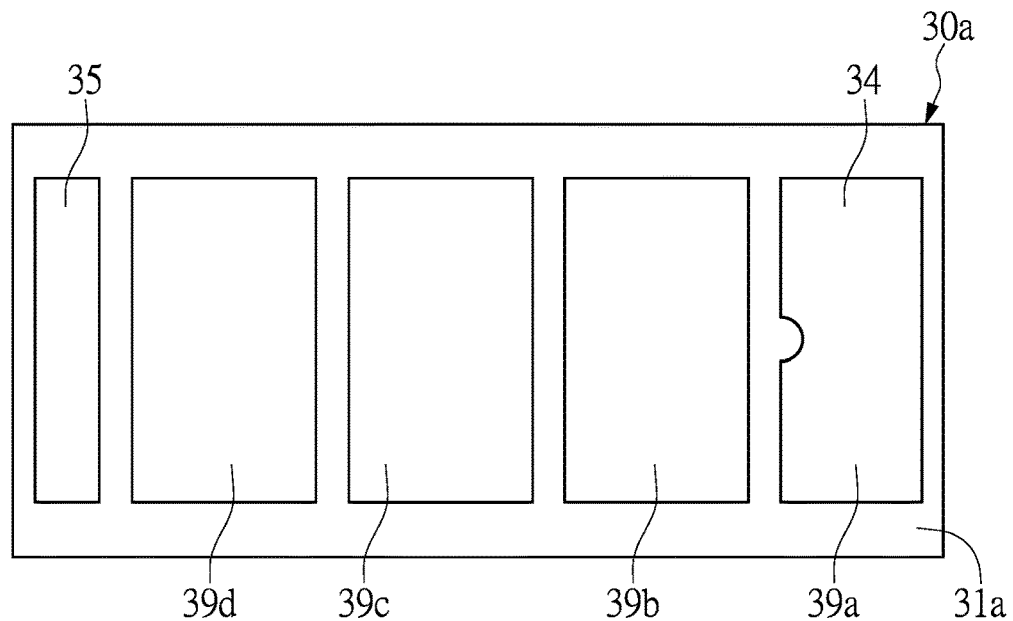
FIG. 2B is a schematic rear view of the second type LED Bar fabrication structure in the first embodiment of the present invention.
Figure 2C:
FIG. 2C is a schematic diagram showing the circuit symbol connection of the second type LED Bar in the first embodiment of the present invention.

FIG. 2A and FIG. 2B disclose the design of the substrate 31a for the LED Bar 30a of the slim linear LED lighting device 1 of the second embodiment. The substrate 31a consists of a designed layout (FIG. 2A) of the conductive layer on the front surface for the mounting and wire bonding (if it is necessary) of all LED chips, and another designed layout (FIG. 2B) of the conductive layer on the bottom surface for surface mounting and thermal dissipation of the LED Bar. In this embodiment, the LED Bar 30a is designed with a circuit in which four LED chips 331, 332, 333, 334 are arranged at equal pitches, and four LED chips are connected in series. The circuit symbol is as shown in FIG. 2C. The LED chips connected in series is only an embodiment, and the present invention is not limited thereto. That is, the present invention can also adopt a circuit design in which all the LED chips are electrically connected in parallel or independently, or in a mix of in series and in parallel. The LED chips 331, 332, 333, 334 are all about 0.4 mm in length and about 0.2 mm in width, and both the P-pad and the N-pad of each LED chip 33 are on the upper surface of the LED chip. The conductive layer on the front surface of the substrate 31a is provided with a die bonding region 311a (the die bonding region 311a may also be referred to as a first die bonding region 311a) of a first LED chip 331, a die bonding region 311b (the die bonding region 311b may also be referred to as a second die bonding region 311b) of a second LED chip 332, a die bonding region 311c (the die bonding region 311c may also be referred to as a third die bonding region 311c) of a third LED chip 333, a die bonding region 311d (the die bonding region 311d may also be referred to as a fourth die bonding region 311d) of a fourth LED chip 334, and a wire bonding region 311e not for die bonding of any LED chips. The first die bonding region 311a is also acted as the positive polarity wire bonding region 312a for the first LED chip 331. After wire bonding process, the first die bonding region 311a becomes the positive polarity region of the first LED chip 331. The second die bonding region 311b is also acted as the positive polarity wire bonding region 312b for the second LED chip 332, and also acted as the negative polarity wire bonding region 313a for the first LED chip 331. After wire bonding process, the first LED chip 331 and the second LED chip 332 form a circuit connection in series. The third die bonding region 311c is also acted as the positive polarity wire bonding region 312c for the third LED chip 333, and also acted as the negative polarity wire bonding region 313b for the second LED chip 332. After wire bonding process, the second LED chip 332 and the third LED chip 333 form a circuit connection in series. The fourth die bonding region 311d is also acted as the positive polarity wire bonding region 312d for the fourth LED chip 334, and also acted as the negative polarity wire bonding region 313c for the third LED chip 333. After wire bonding process, the third LED chip 333 and the fourth LED chip 334 form a circuit connection in series. The wire bonding region 311e is simply acted as the negative polarity wire bonding region 313d for the fourth LED chip 334. After wire bonding process, the wire bonding region 311e becomes the negative polarity region of the fourth LED chip 334. The LED chips 331, 332, 333, 334 are fixed on the substrate 31a by a die bonding process, and the LED chips 33 are arranged in a straight line. The distance between each LED chip 33 is about 0.6 mm, which makes all LED chips to be closely lined up. In this embodiment, the area of the conductive layer of each LED's die bonding region is enlarged due to the connection with the conductive layer of each LED's positive polarity wire bonding region, which can increase the heat conduction area of each LED chip, so that the heat dissipation effect of the LED Bar in this embodiment is improved. Here, the conductive layers of the LED's die bonding regions of the present invention are connected to the conductive layers of the LED's positive polarity wire bonding regions, and are merely illustrative of the embodiment, and the present invention is not limited thereto. FIG. 2B discloses a design arrangement of the conductive layer on the bottom surface of the substrate 31a, corresponding to the design arrangement of the conductive layers of the four die bonding regions on the front surface of the substrate 31a. The bottom layer of the substrate 31a is provided with four independent heat dissipation areas 39a, 39b, 39c, 39d, each of which has at least one heat dissipation area and conductive via hole (not shown in FIG. 2A and FIG. 2B), so that each heat dissipation area is in thermal conducting with the corresponding die bonding region on the upper layer of the substrate to achieve the effect of heat conduction and heat dissipation. The heat dissipation area 39a is also acted as an anode terminal 34 of the LED Bar 30a, and is electrically connected to the positive polarity wire bonding region 312a of the first LED chip 331 via an electrically conductive via hole. The anode terminal 34 of the LED Bar 30a will be connected to the positive polarity of the input power after SMT. Corresponding to the wire bonding region 311e (which also is the negative polarity wire bonding region 313d for the fourth LED chip 334) on the front surface of the substrate 31a, the bottom layer of the substrate 31a is provided with a cathode terminal 35, to which the fourth LED chip negative polarity wire bonding region 313d is electrically connected through a via hole (not shown). The cathode terminal 35 of the LED Bar 30a will be connected to the negative polarity circuit of the input power as it is mounted on the PCB by SMT. In term of average heat dissipation area per LED chip at the same footprint, the present embodiment of four-chip LED Bar has a better heat dissipation or a lower thermal resistance than that of an LED packaged with single LED chip. The slim linear LED lighting device of the present invention is made of plurality of LED Bars 30a by soldering on a PCB via a general SMT process (as shown in FIG. 1A). After being powered on, four LEDs in each LED Bar 30a will be lit up at the same time. Whether all the LED Bars 30a are lit up at the same time or not, it can be determined according to the design of the circuit and the control IC (not shown in the figures).

Figure 3A:
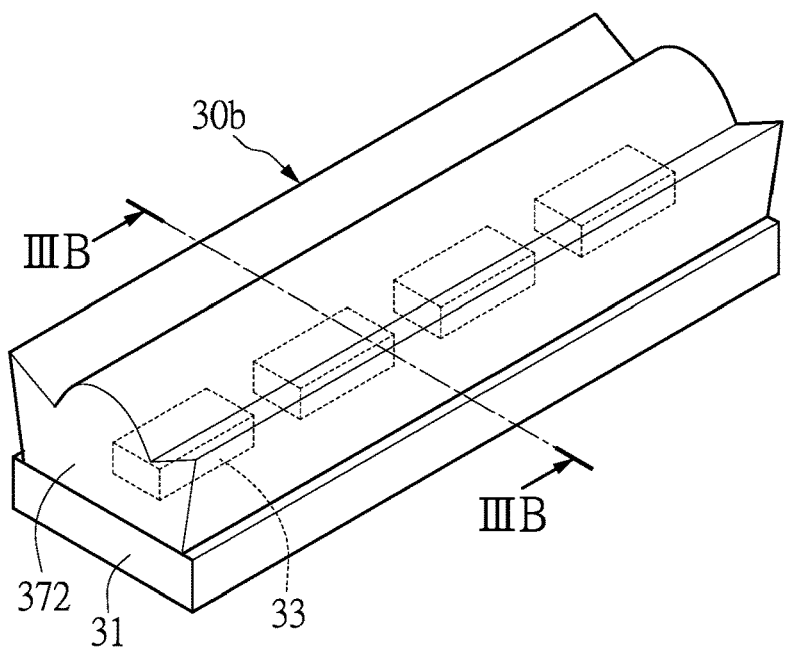
FIG. 3A is a schematic perspective view of the third type LED Bar in the first embodiment of the present invention.
Figure 3B:
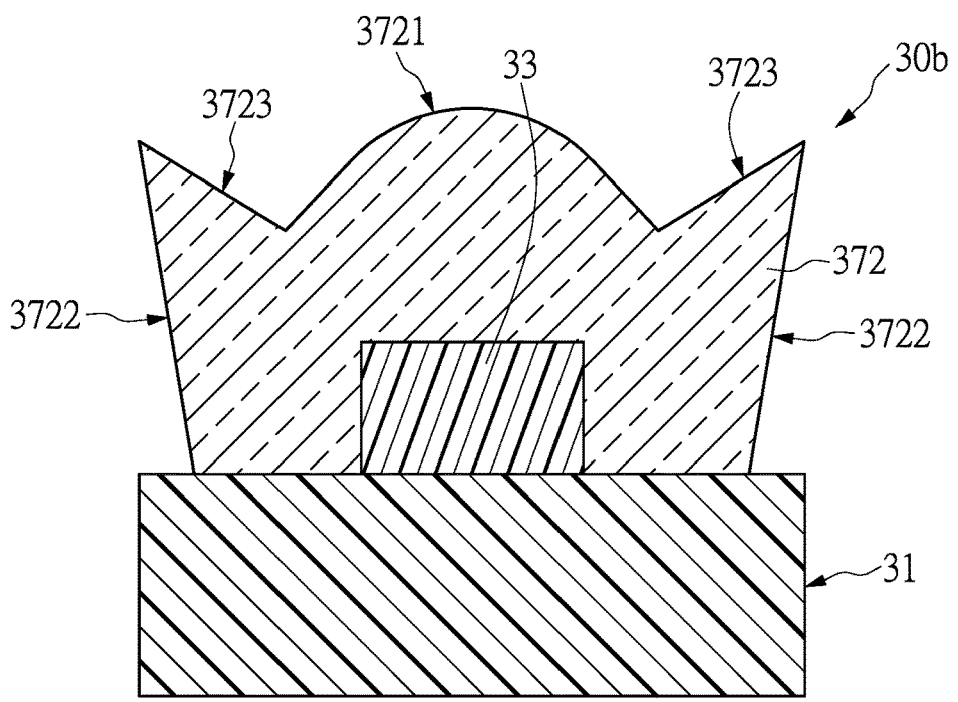
FIG. 3B is a schematic cross-sectional view showing the third type LED Bar in the first embodiment of the present invention.

FIG. 3A and FIG. 3B show a third embodiment of another type of LED Bar 30b used in the slim linear LED lighting device 1 of the present invention, which differs from the first embodiment in the shape of condensing lens 372, and there is a total internal reflection (TIR) condensing structure on both sides of the condensing lens 372, which is designed by optical simulation with regarding the LED chip 33 as a pseudo-point light source. FIG. 3B is a cross-sectional view of FIG. 3A. The cross-sectional curve of the condensing lens 372 remains uniform in the longitudinal direction (the direction in which the LED chips 33 are lined up), such that the light output of the LED chips 33 exhibits a continuous and relatively uniform distribution in the longitudinal direction. In this embodiment, the condensing lens 372 includes a first optical surface 3721, a second optical surface 3722, and a third optical surface 3723. The first optical surface 3721 is a top curved surface of the condensing lens 372, the second optical surfaces 3722 are the surfaces of the two sides of the condensing lens 372, and the third optical surfaces 3723 are the connecting surfaces between the first optical surface 3721 and the second optical surface 3722. As shown in FIG. 3B, the second optical surfaces 3722 are the two inclined surfaces inclining upwardly from the bottom and toward outside thereof respectively, and the shape or curvature of the inclined surface causes the sidelight of the LED chips perpendicular to the direction in which the LED chips 33 are lined up to generate total internal reflection at the second optical surfaces 3722. The first optical surface 3721 is a part of semi-convex arc similar to the design description of the first embodiment, so that the light output generates refraction at the first optical surface 3721 to enable the light output to be condensed toward the center (i.e. front) direction, thereby reducing the beam angle of the light output of the LED Bar 30b in the lateral direction (perpendicular to the direction in which the LED chips 33 are lined up) and further enhancing the luminous intensity in the center (i.e. front) direction. The top ends of the two sides of the condensing lens structure, which are two inclined surfaces inclining from the outside to the inside and from the top to the bottom, form the third optical surfaces 3723, and the third optical surfaces 3723 are surfaces connecting the first optical surface 3721 and the second optical surfaces 3722 to cause the sidelight of the LED chip 33 which generates total internal reflection at the second optical surfaces 3722 directing toward the third optical surfaces and then generating refraction in the third optical surfaces 3723, thereby further reducing the beam angle of the light output of the LED Bar 30b in the lateral direction and enhancing the luminous intensity in the center (i.e. front) direction. The design of the condensing lens 372 of the embodiment is more suitable for the LED chips having strong sidelight, which contributes to the improvement of the front brightness of the LED Bar 30b and the utilization factor of the light in application.

Figure 4A:
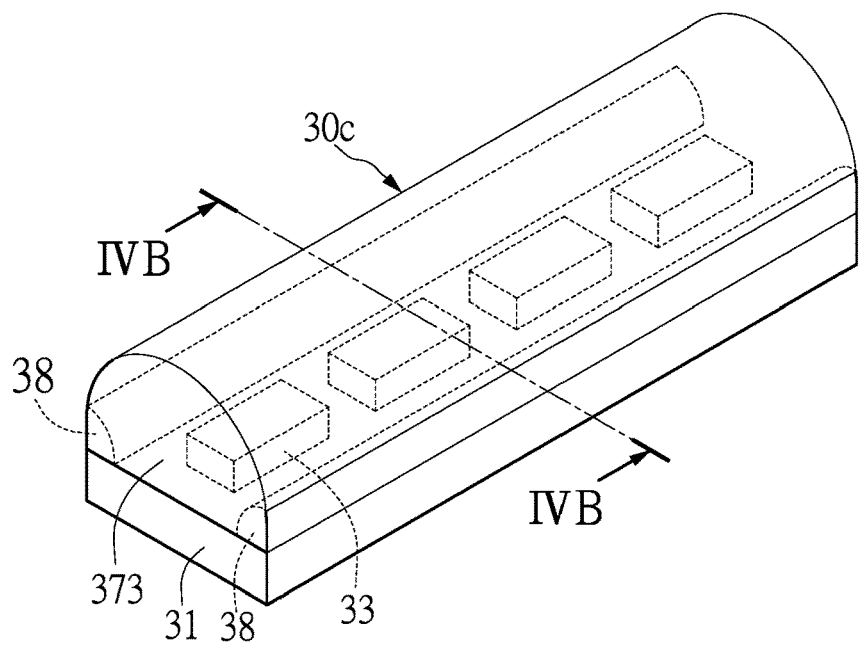
FIG. 4A is a schematic perspective view of the fourth type LED Bar in the first embodiment of the present invention.
Figure 4B:
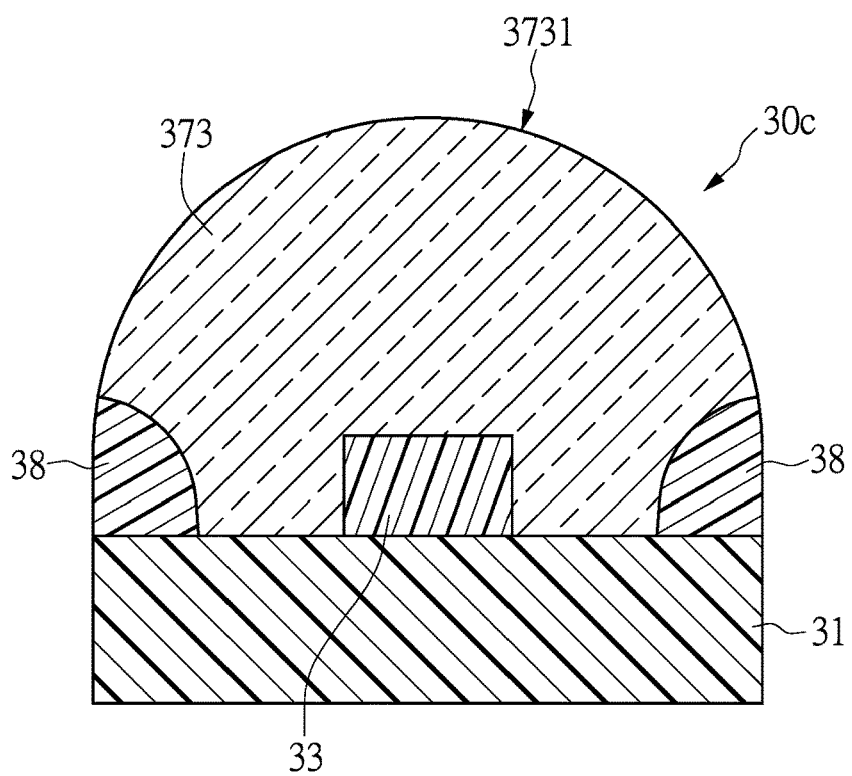
FIG. 4B is a schematic cross-sectional view showing the fourth type LED bar in the first embodiment of the present invention.

FIG. 4A and FIG. 4B show a fourth embodiment of another type of LED Bar 30c used in the slim linear LED lighting device 1 of the present invention, which differs from the first embodiment in that two sides of the condensing lens 373 are provided with a reflective wall 38. In this embodiment, before the silicone molding process, white glue having high reflectivity is used to form the reflective wall 38 along both sides of the LED chip 33 at a suitable distance from the LED chip 33 (between 0.3 mm and 2.0 mm) by a precision dispenser or by screen printing. The height of the reflective wall 38 is about 1 to 5 times the height of the LED chip 33 for reflecting the light output at the side surface of the LED chip 33 in the lateral direction. FIG. 4B is a cross-sectional view of FIG. 4A, wherein the condensing lens 373 includes a reflective wall 38 on each side and a first optical surface 3731; wherein the reflective wall 38 functions as reflecting the sidelight of the LED chip 33 in the lateral direction to change the light output direction toward the front direction, thereby reducing the beam angle of the LED Bar 30c in the lateral direction and enhancing the luminous intensity in the front direction. The first optical surface 3731 is a semi-convex arc shape similar to the design description of the first embodiment. In another embodiment (not shown), the reflective wall 38 may also be constructed of a metal having high reflectivity. The arrangement of the reflective wall 38 can also be applied to other types of LED Bar on other embodiments.

Figure 5A:
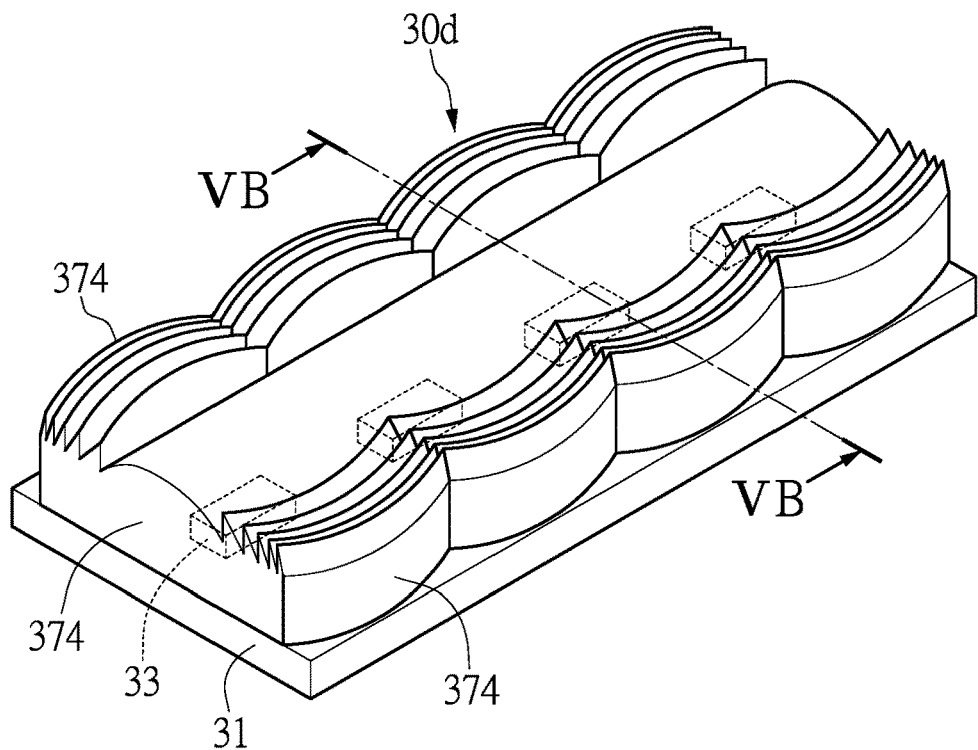
FIG. 5A is a schematic perspective view of the fifth type LED Bar in the first embodiment of the present invention.
Figure 5B:
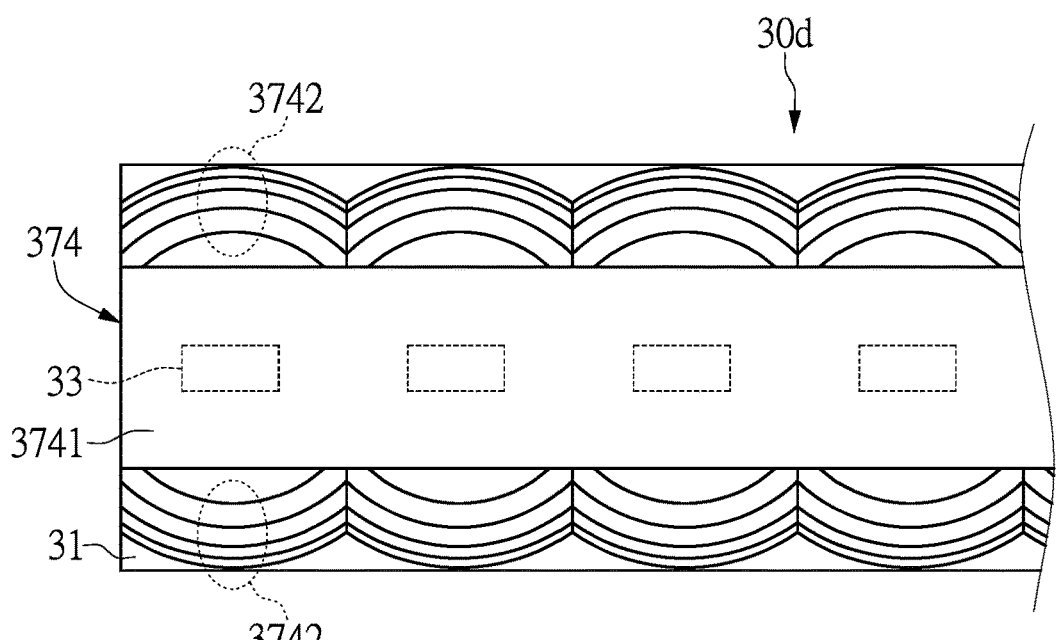
FIG. 5B is a top plan view of the fifth type LED Bar in the first embodiment of the present invention.
Figure 5C:
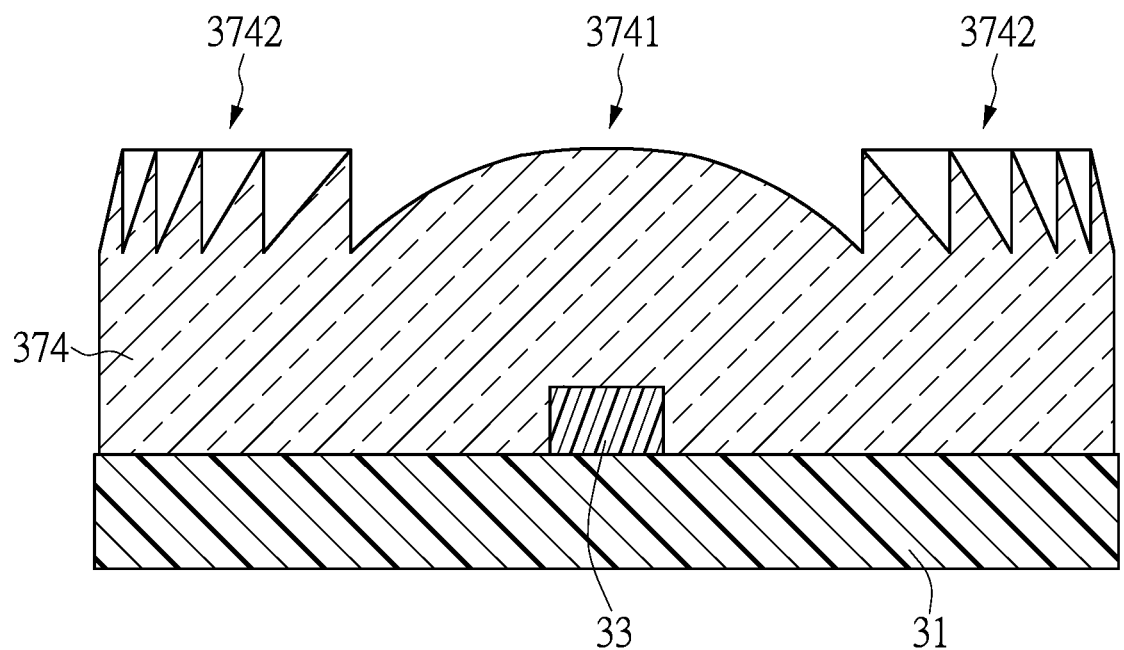
FIG. 5C is a schematic cross-sectional view of the fifth type LED Bar in the first embodiment of the present invention.

FIG. 5A, FIG. 5B and FIG. 5C show a fifth embodiment of another type of LED Bar 30d used in the slim linear LED lighting device 1 of the present invention, which differs from the first embodiment in that the condensing lens 374 is a condensing structure of a Fresnel lens, and has the advantage of making the slim linear LED lighting device of the present invention has a lower height. FIG. 5B is a top plan view of FIG. 5A, and FIG. 5C is a cross-sectional view of FIG. 5A, wherein the strip-shaped condensing lens 374 of the LED Bar 30d has a top central region formed by a convex-arcuate first optical surface 3741. The top side is composed of a second optical surface 3742 formed of a plurality of Fresnel lenses, which is designed by optical simulation with regarding the LED chip 33 as a pseudo-point light source. The upward light output of the LED chip 33 generates refraction at the first optical surface 3741 and the second optical surface 3742 condensing the beam angle of the light output of the LED Bar 30*d* in the lateral direction and enhancing the luminous intensity in the front direction. In FIG. 5B, the second optical surface 3742 is a multi-layered ring structure centered on the LED chip 33 and exhibiting bilateral symmetry. In FIG. 5C, the cross section of the second optical surface 3742 is a continuous zigzag structure. In another embodiment (not shown), in order to make the light output of the LED Bar 30*d* exhibit a more uniform distribution in the longitudinal direction, the multi-layered ring structure of the second optical surface 3742 can be changed to be a multi-layered strip-shaped structure, which allows the cross section of the second optical surface 3742 to maintain a uniform zigzag structure in the longitudinal direction of the LED Bar 30*d*.

Figure 6:
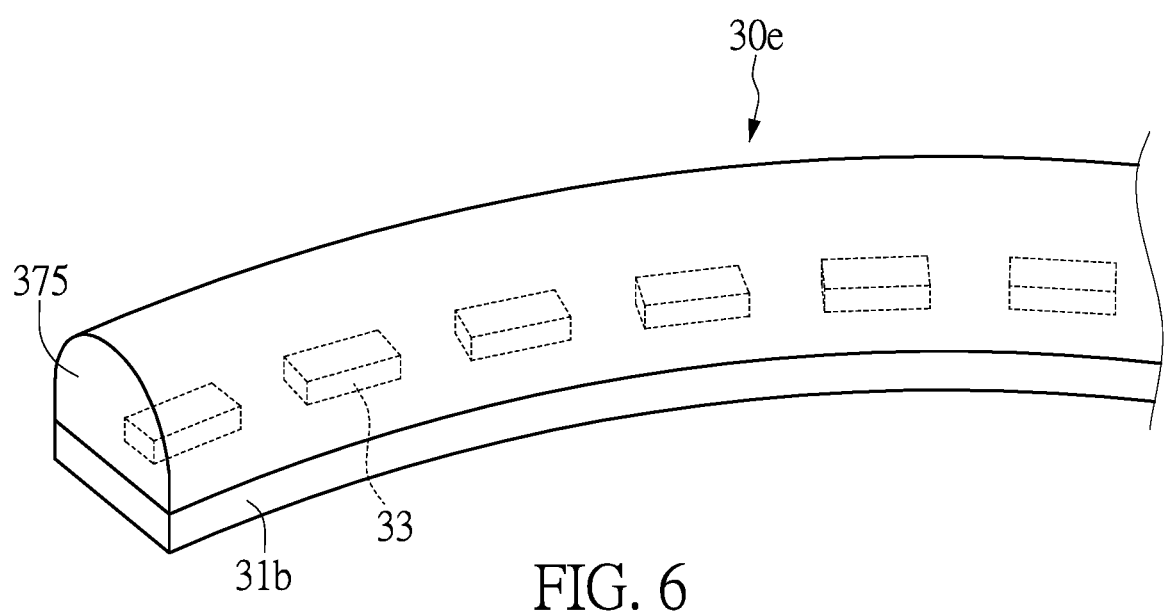
FIG. 6 is a schematic perspective view of an LED Bar in the second embodiment of the present invention.

FIG. 6 shows a sixth embodiment of another type of LED Bar 30*e* used in the slim linear LED lighting device 1*b* of the present invention (similar to that disclosed in FIG. 8), which differs from the first embodiment in that the number of LED chips is more and the LED chips are in a curved arrangement. The design of the substrate 31*b* is different, and the mold cavity structure in the silicone molding process is also different. The curved shape is formed according to the curve of the LED chips 33 arranged, so that the curved condensing lens 375 is formed. Finally, a precision cutting machine is used to cut the substrate 31*b* along the edge of the condensing lens 375 to form a curved strip-shaped LED Bar 30*e* containing a plurality of LED chips. The LED Bar 30*e* of the sixth embodiment may be curved to the left or to the right, and may of course be a curved portion of a partial straight portion or a structural shape of a continuous curved "S" shape. The present invention is not limited thereto.

Figure 7:
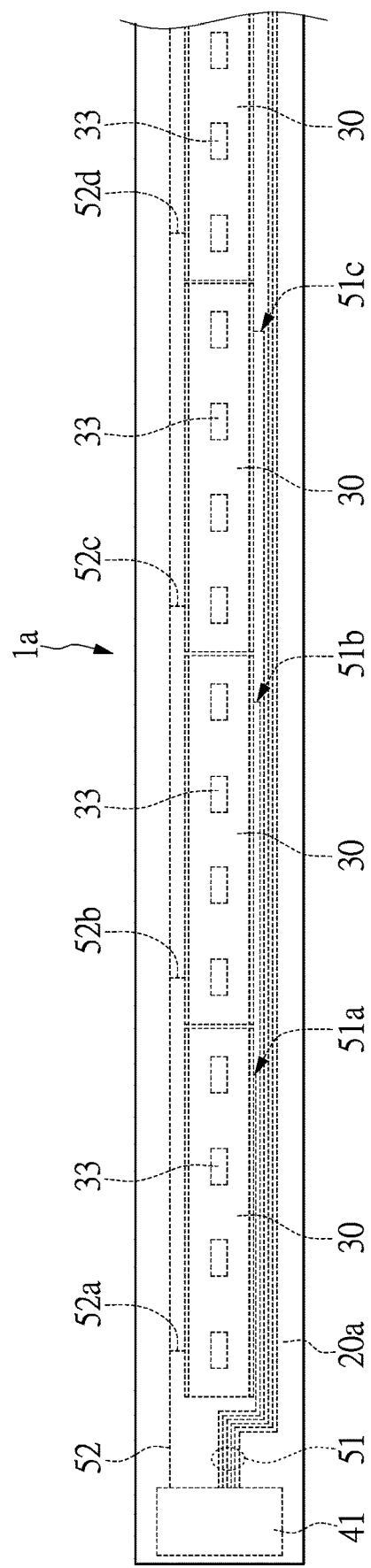
FIG. 7 is a top plan view of the third embodiment of the present invention.

FIG. 7 shows a third embodiment of the slim linear LED lighting device 1*a* of the present invention, which comprises a printed circuit board 20*a* on which a connector 41 is provided and a connecting circuit (including a positive polarity input circuit 51 and a negative polarity input circuit 52), a plurality of LED Bars 30; wherein the plurality of LED Bars 30 are linearly arranged on the printed circuit board 20*a*. Each of the LED Bars 30 is electrically connected to the connector 41 via the respective connecting circuits 51, 52. The conductive layer (i.e., copper foil) on the printed circuit board 20*a* associated with the soldering pads (not shown) and the connecting circuits 51, 52, are arranged following the recommendations of specifications and design needs. In the present embodiment, the external power source or control IC for driving the LED is disposed at outside and the external power source or signal source is transmitted via the connector 41 to the slim linear LED lighting device 1*a* of the present invention. In this embodiment, because of the simple circuit design and no additional heat dissipation requirements, the printed circuit board 20*a* is an FR4 single-layer printed circuit board (PCB), and the positive polarity and negative polarity input lines of all the LED Bars 30 are disposed on the front side of the printed circuit board 20*a*. In this embodiment, the LED Bar 30 is designed according to the LED Bar 30 in the second embodiment, and four LED chips 33 are employed and connected in series. Therefore, each LED Bar 30 only needs to be connected to one positive polarity input line 51 and one negative polarity input 52, so that the four internal LED chips 33 of each LED Bar 30 can be simultaneously lit up by the external input power. In the present invention, the foregoing connecting circuit includes the positive polarity input line 51 and the negative polarity input line 52. In this embodiment, the connector 41 provides a plurality of independent positive polarity input lines 51 and a common negative polarity input line 52, so that each LED Bar 30 can be individually or simultaneously lit up depending on the external input power supply or signal design. Alternatively, the LED Bar 30 can also be lit up in turn to meet the needs of animated lighting. When there are other electrical characteristics requirements, such as electromagnetic compatibility (EMC), current control or signal transmission, related parts, such as capacitors, resistors, inductors and various ICs, can be installed on the printed circuit board 20 according to design requirements to construct another embodiment (not shown) of the present invention.

Figure 8:
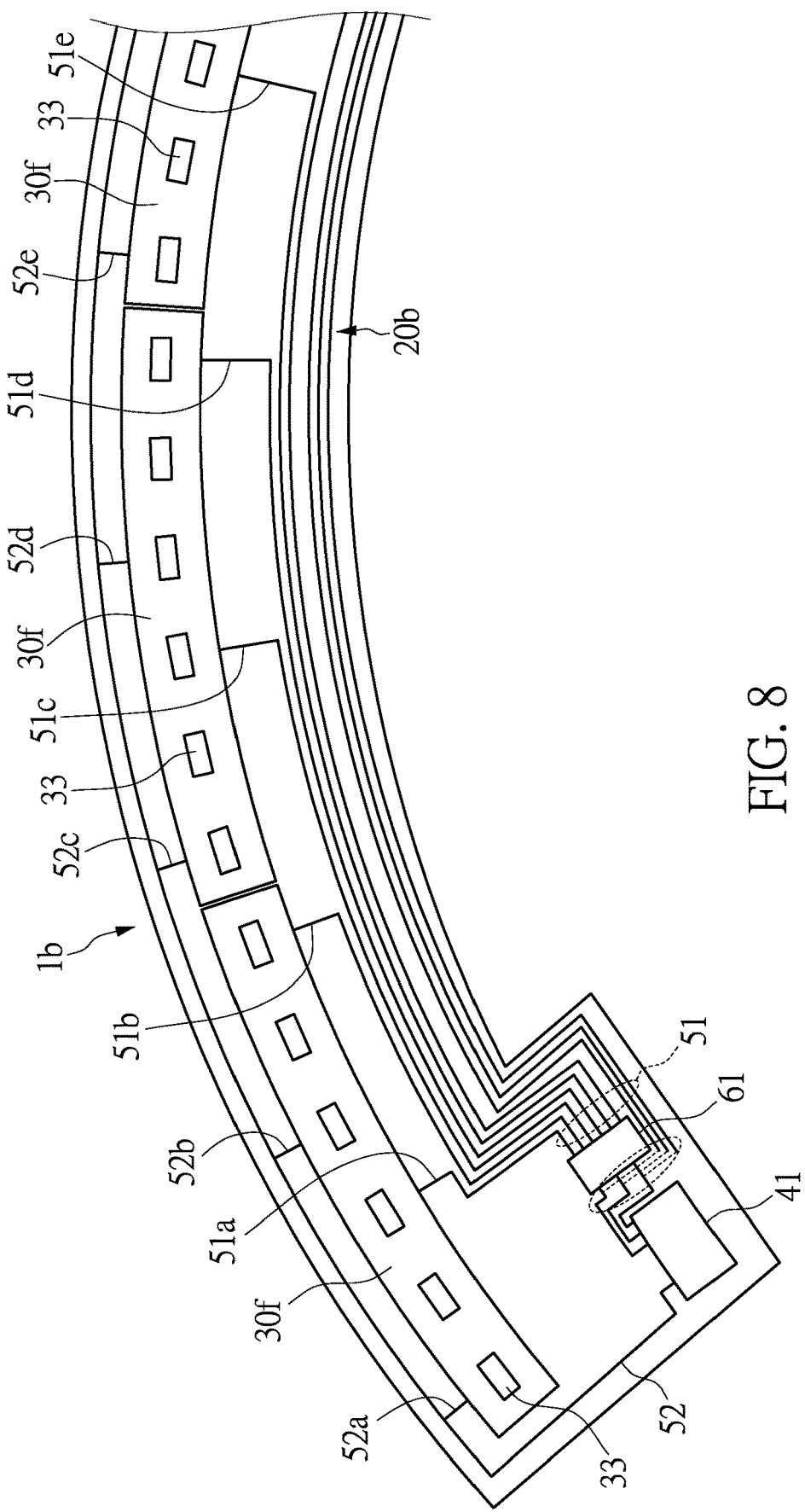
FIG. 8 is a top plan view of the fourth embodiment of the present invention.

FIG. 8 shows a fourth embodiment of the slim linear LED lighting device 1*b* of the present invention, which comprises a printed circuit board 20*b* on which a connector 41 is provided, at least one IC 61 for driving the LED Bars, a connecting circuit (including the positive input circuit 51 and the negative input circuit 52), and the plurality of curved LED Bars 30*f* arranged in an arc shape; wherein each LED Bar 30*f* is electrically connected to the IC for driving LED 61 via the respective connecting circuits 51, 52. Each of the LED Bars 30*f* contains six LED chips 33, and a circuit design in which three LED chips are connected in series is provided. In this embodiment, because of the complicated circuit design, the printed circuit board 20*b* not only exhibits a curved and irregular shape, but also is a double-layered flexible printed circuit board (FPCB) due to complicated circuit design and routing requirements. The FPCB disposed with the connector 41 and the IC for driving LED 61 can be bent downward by 90 degrees to avoid interference with the light blade (not shown) during subsequent assembly. The copper foil on the bottom of the printed circuit board 20*b* provides additional routing design (the dotted lines as shown in FIG. 8) and heat dissipation. If necessary, additional thermal paste and aluminum heat sink (not shown) can be included to provide better heat dissipation. The curved LED Bar 30*f* is formed by a manufacturing method similar to that of the foregoing LED Bar in the sixth embodiment to couple with a thin light blade (not shown) having a curved shape. Each LED Bar 30*f* contains six LED chips 33, and by means of the circuit design of that every three LED chips are connected in series on the printed circuit board 20*b*, two positive polarity input lines 51*a*, 51*b* and two negative polarity input lines 52*a*, 52*b* enable each LED Bar 30*f* to be fully lit up or partially lit up depending on the IC for driving LED 61. The slim linear LED lighting device 1*b* of the present embodiment may be in a curved shape downward or upward, and may of course be partially straight and partially curved or continuously curved in an "S"-shaped structural shape. The present invention is not limited thereto. The present invention can also use LED Bars of different lengths and LED Bars of different curved shapes to arrange on a printed circuit board to form a slim linear LED lighting device, so that applications to different shapes of light blades can be achieved.

Figure 9:
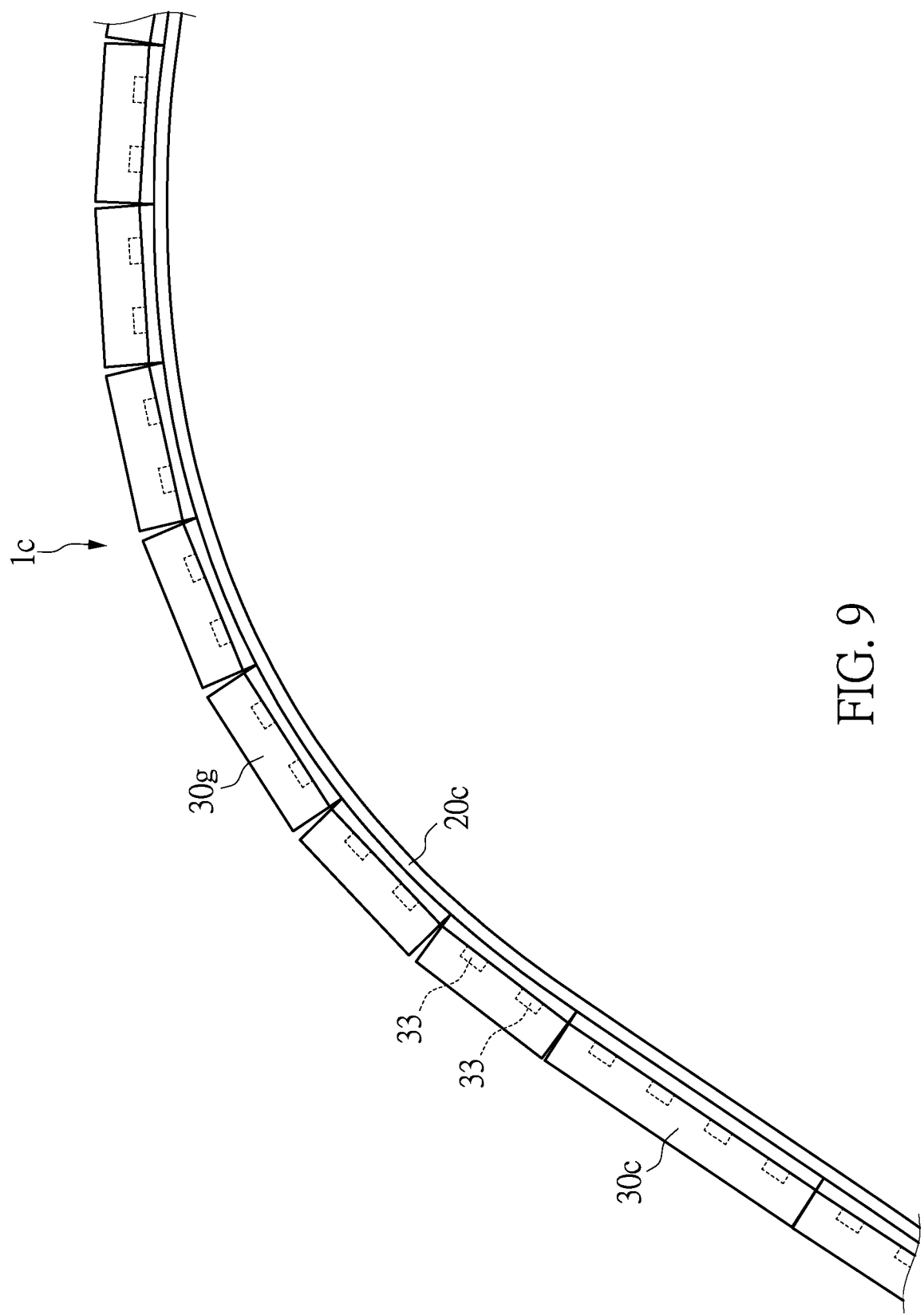
FIG. 9 is a side elevational view showing the fifth embodiment of the present invention.

FIG. 9 is a fifth embodiment of the slim linear LED lighting device 1*c* of the present invention, which comprises a printed circuit board 20*c* on which a plurality of LED Bars 30*c*, a plurality of different LED Bars 30*g*, a control IC (not shown in the figures), an IC for driving LED (not shown), and a connector (not shown) are provided. The LED Bar 30*g* contains a small number of LED chips 33 (two LED chips 33 employed in this embodiment) and has a short length. In the slim linear LED lighting device 1*c* of the embodiment, the printed circuit board 20*c* is a flexible printed circuit board (FPCB), so that the portion where the short LED Bars 30*g* are mounted has better bending characteristics and can be coupled with a light blade (not shown) having a portion of curved shape. The LED Bars 30*c* contain more LED chips 33 (four LED chips 33 employed in this embodiment), and are disposed in a portion of the slim linear LED lighting device 1c that does not need to be bent.

Figure 10:
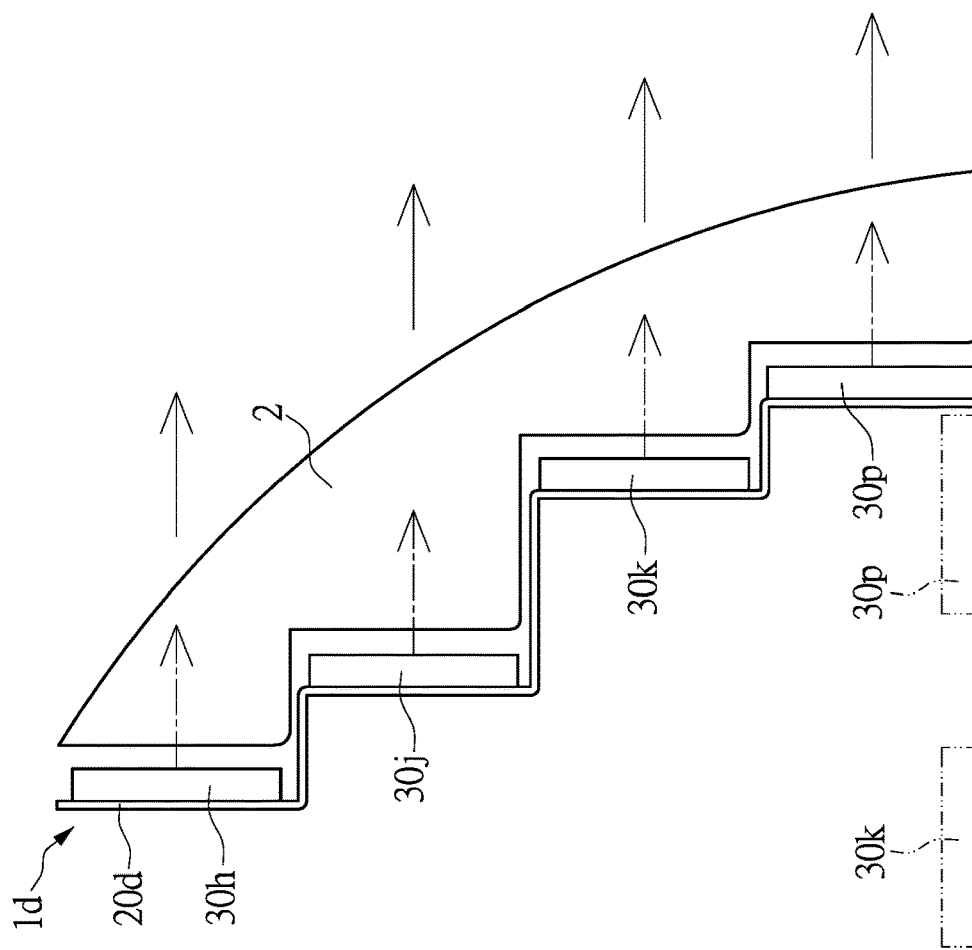
FIG. 10 is a side elevational view of the sixth embodiment of the present invention.

FIG. 10 is a sixth embodiment of a slim linear LED lighting device 1d according to the present invention, comprising a printed circuit board 20d on which four LED Bars, LED Bar 30h, LED Bar 30j, LED Bar 30k and LED Bar 30p, a control IC (not shown), an IC for driving LED (not shown) and a connector (not shown) are provided. The printed circuit board 20d is an FPCB. The lengths of the LED Bar 30h, the LED Bar 30j, the LED Bar 30k and the LED Bar 30p are determined according to the design requirement, which can be equal or unequal. These four LED Bars are disposed on the flexible printed circuit board 20d at a specific pitch, so that the slim linear LED lighting device 1d of the present invention is flexible. In the application to a linear vehicular lamp made of light blade 2 having a curved outer surface, the slim linear LED lighting device 1d and the light blade 2 can be assembled in the manner as shown in FIG. 10 to achieve a better performance for photometry test. As shown in FIG. 10, the dotted line is a state in which the slim linear LED lighting device 1d of the present invention is laid flat, and the solid line in FIG. 10 indicates that the printed circuit board 20d is subjected to continuous L-shaped stepwise bending and supported by a plastic frame or an A1 heat sink (not shown). By combining with the light blade 2, such a structure enables the light-emitting surfaces of the LED Bar 30h, the LED Bar 30j, the LED Bar 30k, and the LED Bar 30p to be all oriented in a desired direction (as indicated by the direction of the arrow in the figure). When a streamlined vehicular lamp is designed with a light blade having a curved outer surface, the normal direction of some part of vehicular lamp cannot be directed toward the H-V direction of the photometry test, which makes it difficult to pass the photometry test, or a brighter LED light source is required to meet the photometry. This embodiment is applied to such streamlined vehicular lamps, and the front (or center) light-emitting direction of each LED Bar can be directed toward the H-V direction of the photometry test or the desired direction, so that the light output of each LED Bar of the slim linear LED lighting device of the present invention has an additive effect in the required direction. In other words, the present embodiment enables a linear vehicular lamp made of the slim linear LED lighting device of the present invention to have less LED light output accompanied by less input power and less heat to meet photometry test.

Figure 11:
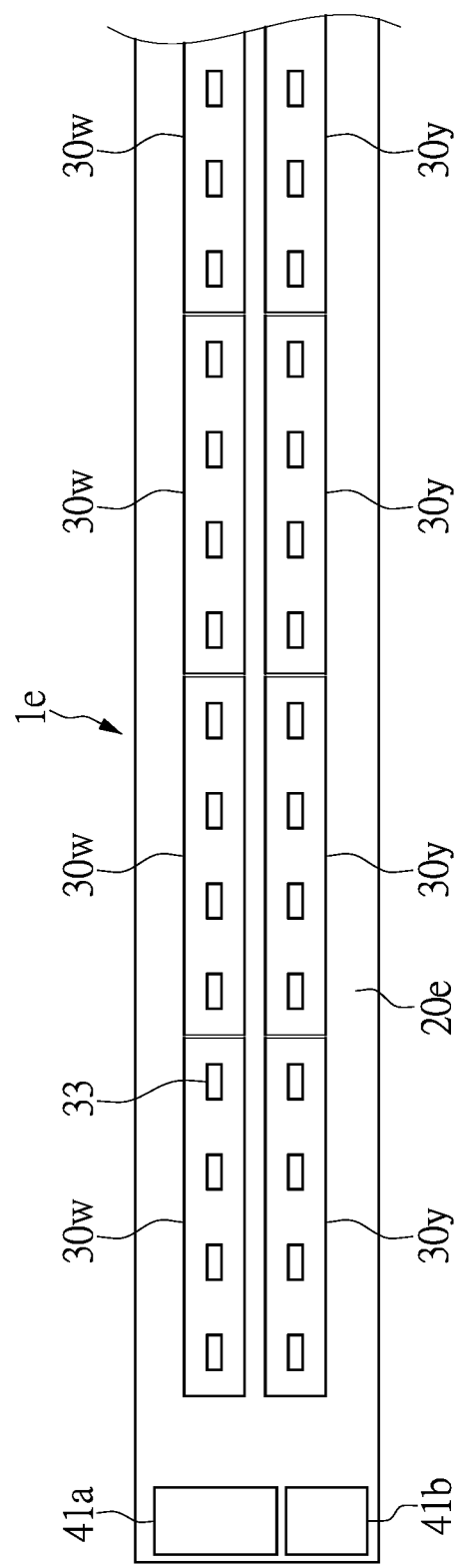
FIG. 11 is a top plan view of the seventh embodiment of the present invention.

FIG. 11 is a seventh embodiment of a slim linear LED lighting device 1e according to the present invention, comprising a printed circuit board (PCB) 20e, connectors 41a, 41b, a plurality of LED Bars 30w, 30y, and a connecting circuit (not shown), which is completed through the SMT process. What is different from the first embodiment is that the seventh embodiment is provided with the LED Bars 30w and the LED Bars 30y arranged closely in a straight line respectively on the printed circuit board 20e, in which the two LED Bars 30w, 30y are parallel. As shown in FIG. 11, one row of LED Bars arranged in a line closely is composed of the LED Bar 30w and electrically connected to the connector 41a via a connecting circuit (not shown), and the LED Bar 30w can emit white light after being powered on. The other row of LED Bars arranged in a line closely is composed of the LED Bar 30y and electrically connected to the connector 41b via a connecting circuit (not shown), and the LED Bar 30y can emit yellow light after being powered on. The present embodiment enables the slim linear LED lighting device 1e to become a linear light source capable of emitting white light and yellow light respectively when the power is turned on. When applied to a vehicular lamp designed with a light blade structure, the vehicular lamp can perform the daily running lamp (white light) and the front turn signal lamp (yellow light) respectively. Other applications of this embodiment do not limit the two different LED Bars to be LED Bars that emit white light and LED Bars that emit yellow light. Depending on the actual application requirements, LED Bars that emit other colors of light may be used.

In summary, the slim linear LED lighting device of the present invention is a linear LED lighting device having a small thickness, a small width, and uniform light distribution in longitudinal direction, which is different from the conventional LED lighting devices. The present invention adopts a special LED package containing multiple LED chips called as LED Bar, which has a condensing lens structure as a part of package to condense the beam angle in the lateral direction of the LED Bar and has small dimension in thickness and width. This LED Bar visually exhibits a continuous and uniform illumination in the longitudinal direction as lit up. The present invention effectively solves the technical problem that lamps using conventional LED as the light source in the prior art has visually non-uniform light distribution or bright spots. As the present invention is applied to the vehicular lamp with the light blade structure, it can not only satisfy the requirements of animated lighting function, but also visually enhance the high quality of the vehicular lamp by the advantage of the uniform light distribution. Moreover, the slim dimension of the light source and the structure of the condensing lens increase the utilization factor of light for the light entering the thin light blade. Consequently, the present invention enables a linear vehicular lamp to meet the photometry requirements with less light output which is always associated with less power input and less heat. Obviously, the technical content of the present invention has strong patentability.

What is claimed is:
1. A slim linear LED lighting device, comprising:
a printed circuit board of which an upper layer is provided with a connecting circuit;
at least one power input component; and
a plurality of LED Bars;
wherein the said power input component and the said LED Bars are mounted on the said printed circuit board, the said LED Bars are linearly arranged on the said printed circuit board, and electrically connected to the said power input component through the said connecting circuit provided on the said printed circuit board;
wherein the said LED Bar is formed by a plurality of the same kind of LED chips arranged linearly and apart equidistantly on an upper layer of a substrate in a spacing of 0.2 mm to 3.0 mm; wherein the said substrate has electrically conductive layers on the upper layer and the bottom layer to enable the said LED Bar to be mounted on the printed circuit board by SMT process;
wherein the said LED Bar is integrally formed by a molding process during a package process and has a slim strip shaped condensing lens structure, so that the beam angle of the said LED Bar perpendicular to the longitudinal direction that the plurality of LED chips are lined up is condensed to be between 10 and 80 degrees, and wherein the slim strip shaped condensing lens structure is integrally formed in the said LED Bar by the molding process and fully covers the all LED chips in the said LED Bar.

2. The slim linear LED lighting device according to claim 1, wherein the cross section of the slim strip-shaped condensing lens structure of the said LED Bar is formed of a first optical surface having a semi-convex arc, so that the beam angle of the said LED Bar perpendicular to the longitudinal direction that the plurality of LED chips are lined up is condensed to be between 10 and 80 degrees.

3. The slim linear LED lighting device according to claim 1, wherein:
the strip-shaped condensing lens structure of the said LED Bar is formed of a first optical surface, a second optical surface and a third optical surface;
the said first optical surface has a convex arc in cross section and forms on the top portion of the condensing lens structure;
two sides of the condensing lens structure, which are two inclined surfaces inclining upwardly from the bottom and toward outside of the condensing lens structure respectively, form the said second optical surface;
the top ends of the two sides of the condensing lens structure, which are two inclined surfaces inclining from the outside to the inside and from the top to the bottom, form the said third optical surface, and the said third optical surface connects the said first optical surface and the said second optical surface to make the side light of the LED chips change direction due to total internal reflection on the said second optical surface and refraction on the said third optical surface, toward the front direction of the LED chips, so that the beam angle of the said LED Bar perpendicular to the longitudinal direction that the plurality of LED chips are lined up is condensed to be between 10 and 80 degrees.

4. The slim linear LED lighting device according to claim 1, wherein the top central region of the strip-shaped condensing lens structure of the said LED Bar is formed of a first optical surface of which the cross section is a convex arc, and the sides at the top central region are formed of a second optical surface of a plurality of Fresnel lenses, so that the beam angle of the said LED Bar perpendicular to the longitudinal direction that the plurality of LED chips are lined up is condensed to be between 10 and 80 degrees.

5. The slim linear LED lighting device according to claim 1, wherein the strip-shaped condensing lens of the said LED Bar is provided with a reflective wall on both sides along the longitudinal direction that the plurality of LED chips are lined up, and the height of the said reflective wall is 1 to 5 times the height of the LED chip.

6. The slim linear LED lighting device according to claim 5, wherein the said reflective wall is made of white glue or a metal having high reflectivity.

7. The slim linear LED lighting device according to claim 1, wherein the said LED Bars are all curved or curved in part.

8. The slim linear LED lighting device according to claim 1, wherein the said printed circuit board is a flexible printed circuit board, and some of the said LED Bars having a shorter length and containing a smaller number of LED chips, so that the slim linear LED lighting device is bendable.

9. The slim linear LED lighting device according to claim 1, wherein all the LED chips in the said LED Bar are electrically connected in series via the electrically conductive layer on the upper layer of the substrate, so that all the LED chips in each LED Bar are lit up simultaneously.

10. The slim linear LED lighting device according to claim 1, wherein on the said printed circuit board, each LED Bar is connected to the power input component via a separate connecting circuit, so that each LED Bar is individually lit up according to an external power source or a signal source, and the function of animated lighting is presented.

11. The slim linear LED lighting device according to claim 1, wherein the plurality of the said LED Bars are closely arranged, so that the spacing of all adjacent LEDs is uniform on the slim linear LED lighting device, and the lighting of the slim linear LED lighting device exhibits visually a uniform light distribution along the alignment direction of the LED chips.

12. The slim linear LED lighting device according to claim 1, wherein the said printed circuit board is a flexible printed circuit board, the plurality of the said LED Bars are disposed on the said flexible printed circuit board at a specific pitch, and the said slim linear LED lighting device is bendable into a continuous L-shaped step-like structure that allows the light-emitting surfaces of the said LED Bars on the said slim linear LED lighting device to face a specific direction.

13. The slim linear LED lighting device according to claim 12, wherein only the light-emitting surfaces of some of the said LED Bars face the required specific direction.

14. The slim linear LED lighting device according to claim 1, wherein:
each of the plurality of the said LED Bars is electrically connected to at least one power positive polarity input line and at least one power negative polarity input line of the said connecting circuit; and
a connector is disposed on the said printed circuit board, and the said connector is electrically connected to the positive polarity input line and the negative polarity input line of the said connecting circuit, for serving as a connection to an external input power to turn on the said LED Bars.

15. The slim linear LED lighting device according to claim 1, wherein:
the plurality of the said LED Bars consist of two kinds of LED Bars emitting two different colors of light, and all the LED Bars emitting a first color light are arranged in a line on the said printed circuit board, and all the LED bars emitting a second color light are arranged in another line on the said printed circuit board; and
all the LED Bars emitting the first color light and all the LED Bars emitting the second color light are parallel to each other and arranged on the same printed circuit board.

16. The slim linear LED lighting device according to claim 15, wherein the said LED Bars consist of the LED Bars emitting white light and the LED Bars emitting yellow light.

17. A slim linear LED lighting device, comprising:
a printed circuit board of which an upper layer is provided with a connecting circuit; at least one power input component;
at least one IC for driving LED; and
a plurality of LED Bars;
wherein the said power input component, the said IC, and the said LED Bars are disposed on the said printed circuit board, the said LED Bars are linearly arranged on the said printed circuit board, each LED Bar is electrically connected to the said IC through the said connecting circuit on the said printed circuit board, and the said IC is electrically connected to the said power input component through the said connecting circuit on the said printed circuit board;

wherein the said LED Bar is formed by a plurality of the same kind of LED chips arranged linearly and apart equidistantly on an upper layer of a substrate in a spacing of 0.2 mm to 3.0 mm; wherein the said substrate has electrically conductive layers on the upper layer and the bottom layer to enable the said LED Bar to be mounted on the said printed circuit board by SMT process; and wherein the said LED Bar is integrally formed by a molding process during package process and has a slim strip shaped condensing lens structure, so that the beam angle of the said LED Bar perpendicular to the longitudinal direction that the plurality of LED chips are lined up is condensed to be between 10 and 80 degrees; and wherein the slim strip shaped condensing lens is integrally formed in the said LED Bar by the molding process, and fully covers the all LED chips in the said LED Bar.

18. The slim linear LED lighting device according to claim 17, wherein:

the plurality of the said LED Bars consist of two kinds of LED Bars emitting two different colors of light, and all the LED Bars emitting a first color light are arranged in a line on the said printed circuit board, and all the LED Bars emitting a second color light are arranged in another line on the said printed circuit board; and all the LED Bars emitting the first color light and all the LED Bars emitting the second color light are parallel to each other and arranged on the same printed circuit board.

19. The slim linear LED lighting device according to claim 18, wherein the said LED Bars consist of the LED Bars emitting white light and the LED Bars emitting yellow light.

* * * * *